US009897923B2

(12) United States Patent
Endres (10) Patent No.: US 9,897,923 B2
(45) Date of Patent: Feb. 20, 2018

(54) MICROMIRROR ARRAY (71) Applicant: Carl Zeiss SMT GmbH, Oberkochen (DE)

(72) Inventor: Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/019,113

(22) Filed: Feb. 9, 2016

(65) Prior Publication Data

US 2016/0154318 A1    Jun. 2, 2016

Related U.S. Application Data (63) Continuation of application No. PCT/EP2014/068041, filed on Aug. 26, 2014.

(30) Foreign Application Priority Data

Aug. 29, 2013  (DE) .......................... 10 2013 217 269

(51) Int. Cl.
*G03F 7/20* (2006.01)
*G02B 26/08* (2006.01)
*G02B 5/08* (2006.01)
*G02B 5/09* (2006.01)

(52) U.S. Cl.
CPC ........... *G03F 7/702* (2013.01); *G02B 5/0891* (2013.01); *G02B 5/09* (2013.01); *G02B 26/0833* (2013.01); *G03F 7/70075* (2013.01)

(58) Field of Classification Search
CPC ................ G03F 7/702; G03F 7/70075
USPC ....................... 355/67; 359/490–492
See application file for complete search history.

(56) References Cited

U.S. PATENT DOCUMENTS

| | | | |
|---|---|---|---|
| 6,859,515 B2 | 2/2005 | Schultz et al. | |
| 2002/0024641 A1* | 2/2002 | Ilkov ............... | B82Y 30/00 353/99 |
| 2004/0125346 A1 | 7/2004 | Huibers | |
| 2004/0125347 A1* | 7/2004 | Patel .............. | G03B 21/28 353/98 |
| 2007/0241417 A1* | 10/2007 | Huibers ............ | G02B 26/0841 257/436 |
| 2008/0013680 A1 | 1/2008 | Singer et al. | |
| 2011/0318696 A1 | 12/2011 | Endres | |
| 2015/0062549 A1 | 3/2015 | Patra et al. | |

FOREIGN PATENT DOCUMENTS

| | | |
|---|---|---|
| DE | 10 2012 207 866 A1 | 11/2013 |
| EP | 1 225 481 A2 | 7/2002 |
| WO | WO 2010/099807 A1 | 9/2010 |

OTHER PUBLICATIONS

International Search Report, with translation thereof, for corresponding PCT Appl No. PCT/EP2014/068041, dated Nov. 28, 2011.
German Office Action, with translation thereof, for corresponding DE Appl No. 10 2013 217 269.9, dated Feb. 24, 2014.

* cited by examiner

*Primary Examiner* — Hung Henry Nguyen
(74) *Attorney, Agent, or Firm* — Fish & Richardson P.C.

(57) ABSTRACT

A micromirror array has the form of a sheared rectangle. In an arrangement in an illumination optical unit, one side is aligned perpendicular to a scanning direction.

20 Claims, 6 Drawing Sheets

MICROMIRROR ARRAY

CROSS-REFERENCE TO RELATED APPLICATIONS

This application is a continuation of, and claims priority under 35 U.S.C. § 120 to, international application serial number PCT/EP2014/068041, filed Aug. 26, 2014, which claims benefit under 35 U.S.C. § 119 of German patent application serial number 10 2013 217 269.9, filed Aug. 29, 2013. International application serial number PCT/EP2014/068041 and German patent application serial number 10 2013 217 269.9 are incorporated by reference herein.

FIELD

The disclosure relates to a micromirror array, an optical assembly with such a micromirror array, an illumination optical unit with such an optical assembly, an illumination system with such an optical assembly, a projection exposure apparatus with such an illumination optical unit, and a method for producing a microstructured or nanostructured component.

BACKGROUND

It is important in microlithography to illuminate an object field with a predetermined intensity distribution. Unwanted intensity variations should be avoided here. However, when using multi mirror arrays (MMAs), there can be unwanted intensity variations in the object plane due to the gaps, due to the construction, which are present between the mirrors.

Multi mirror arrays for illumination optical units of a projection exposure apparatus are known, for example, from WO 2010/099807 A1 and DE 10 2012 207 866.5.

SUMMARY

The disclosure seeks to provide an improved a micromirror array for a projection exposure apparatus.

The disclosure provides a micromirror array including a multiplicity of micromirrors with individual reflection surfaces, which each have a non-rectangular form, wherein the micromirror array has a parallelogram-shaped overall reflection surface.

In particular, the overall reflection surface has a non-rectangular form.

In particular, the micromirrors have a polygonal form. In particular, they are embodied as a quadrilateral. However, they can also have a triangular embodiment. Preferably, they have a parallelogram-shaped embodiment. In particular, they have at least one internal angle that is greater than 100°.

In particular, the micromirror array has an overall reflection surface which, apart from the scaling, corresponds to the form of the individual reflection surfaces of the micromirrors. Here, the scaling factors in the direction parallel to adjacent sides of the individual reflection surfaces may be different.

In particular, the micromirrors have a form which, in terms of geometry, is similar to that of the micromirror array, in particular including the mechanics surrounding the micromirrors. In particular, the individual reflection surfaces have a form which, in terms of geometry, is similar to that of the overall reflection surface.

In particular, the micromirrors have individual reflection surfaces which are reflective for radiation in the EUV range, in particular for radiation with a wavelength in the range of 5 nm to 30 nm. In particular, the individual reflection surfaces can have a multi layer coating.

The individual reflection surfaces of the micromirrors can each have a planar embodiment. They can also have an embodiment with convex or concave curvature.

In particular, the individual mirrors are displaceable. Preferably, they each have at least one, in particular at least two tilt degrees of freedom. In other words, they are preferably swivelable. They can also have a linear degree of freedom. In particular, they can be displaceable in a direction perpendicular to the reflection surface thereof.

Apart from the spacing between the individual mirrors due to the construction, the micromirror array is tessellated without gaps. In other words, the overall reflection surface is free from interstices. In particular, the micromirror array has a multiplicity of lines and columns. In other words, the micromirrors are arranged in lines and columns. The number of lines and columns is in particular at least two, in particular at least three, in particular at least five, in particular at least ten, in particular at least 20, in particular at least 30, in particular at least 40. The number of lines and columns can be equal. It can also differ. The overall number of micromirrors in the micromirror array can be more than 50, in particular more than 100, in particular more than 200, in particular more than 300, in particular more than 1000.

As a result of such an embodiment of the micromirror array, it is possible to arrange the micromirror array in such a way that the line orientation or column orientation is perpendicular to the scanning direction. In particular, it is possible by way of this arrangement to efficiently suppress unwanted intensity variations in the object plane. In particular, the micromirror array is embodied in such a way that it has a boundary edge which can be aligned perpendicular to the scanning direction.

In accordance with one aspect of the disclosure, the overall reflection surface has a smooth edge. In particular, the edge of the overall reflection surface is not jagged. This also reduces intensity losses and/or uniformity variations in the object plane. Moreover, this simplifies and/or improves the approximation of the object field to be illuminated by one or more micromirror arrays.

What has emerged in particular is that the micromirror array according to the disclosure enables an illumination of the object field with a uniformity of better than 1%, in particular better than 0.5%, in particular better than 0.3%, in particular better than 0.2%, in particular better than 0.1%. The specified values in each case denote an upper limit for maximum uniformity variations, i.e. the maximum uniformity error. In particular, the micromirror array according to the disclosure leads to significant improvement in the illumination of the object field.

The overall reflection surface has a smooth edge, in particular in the direction perpendicular to the scanning direction. In other words, it is delimited by two edge portions lying opposite one another with respect to the scanning direction, each of which have a smooth, in particular not jagged, embodiment. Preferably, the other two edge portions lying opposite one another in the direction perpendicular to the scanning direction also have a smooth embodiment. However, the latter can also have a jagged embodiment.

A further object of the disclosure consists of improving an optical assembly for a projection exposure apparatus. This object is achieved by an optical assembly with at least one micromirror array as described above. The advantages are evident from those of the micromirror array.

Preferably, the optical assembly includes a multiplicity of such micromirror arrays. In particular, the micromirror arrays of the assembly are in turn arranged in lines. They can be arranged in the style of a tessellation. They preferably have a modular embodiment. They can also be interchangeable.

Moreover, it is possible for a plurality of micromirror arrays of the same assembly to be connected with a common control device in a signal-transmitting manner. In particular, the optical assembly can include a control device by which a plurality of micromirror arrays of this assembly are controllable. In particular, it is possible to actuate all micromirror arrays of an assembly using one such control device.

In particular, the control device serves to control the displacement, i.e. the positioning, of the individual mirrors.

The number of micromirror arrays in the assembly is in particular at least two, in particular at least three, in particular at least four, in particular at least eight, in particular at least fifteen, in particular at least thirty, in particular at least 100, in particular at least 300.

In particular, the optical assembly is embodied as a micro-electromechanical system (MEMS).

The disclosure also seeks to provide an improved an illumination optical unit for transmitting illumination radiation from a radiation source into an object field. This disclosure provides an illumination optical unit with an optical assembly.

In accordance with one aspect of the disclosure, the at least one micromirror array is arranged in such a way in each case that, in the case of impingement with illumination radiation, it leads to an illumination field in the object plane in each case, the illumination field having a boundary, which corresponds to a corresponding boundary of the object field in a scanning direction. In the case of a straight object field with an edge perpendicular to the scanning direction, the boundary of the illumination field is likewise straight-lined, in particular parallel, in relation to the edge of the object field. In particular, this can be achieved by a straight-lined boundary of the overall reflection surface of the micromirror array. In particular, the micromirror arrays are arranged in such a way that one of the boundary edges thereof is in each case aligned perpendicular to the scanning direction.

In the case of a curved object field, the illumination field can also have a correspondingly curved first boundary. However, here, the overall reflection surface of the micromirror array can nevertheless have a straight-lined edge. The latter can be imaged in an illumination field with a curved edge via optical elements arranged between the micromirror array and the illumination field.

As a result of such an embodiment of the micromirror array, the efficiency of the illumination of the object field can be ensured and/or improved.

In accordance with a further aspect of the disclosure, the boundary of the illumination field against the scanning direction, i.e. the second boundary lying opposite the first boundary, has a corresponding embodiment. In particular, the first and second boundary can be embodied with a parallel offset from one another. They can also have different radii of curvature.

In accordance with a further aspect of the disclosure, the two boundaries of the illumination field lying opposite to one another with respect to the scanning direction have a distance from one another which corresponds to the size of the object field, effectively employable for the illumination of the reticle, in the scanning direction, including an edge-side tolerance range in each case. The size of the object field in the scanning direction effectively employable for the illumination of the reticle, also referred to as effective slot length, in this case corresponds to the size provided by the lens, minus the tolerances for manufacturing, adjustment and operational stability.

In particular, the micromirror array in each case has such an embodiment that it is subdividable into an integer number of micromirror groups in a direction corresponding to the illumination of the object field in the scanning direction, wherein each of these micromirror groups, when impinged upon by illumination radiation, in each case leads to an illumination field in the object plane which has a height $h_{BF}$ in the scanning direction which corresponds to the height $h_{OF}$ of the object field in the scanning direction, excluding the edge-side tolerance ranges. In other words, the micromirror array is embodied in such a way, in particular, that it is subdividable into an integer number of virtual facets in a direction corresponding to the scanning direction. Here, each one of the facets, in particular, has such an embodiment that the size of the image thereof in the scanning direction in the reticle corresponds to the effective slot length.

What can be achieved hereby is that the edges of the overall reflection surface of the micromirror array extending perpendicular to the scanning direction are not imaged into the used region, in particular not into the object field.

In accordance with a further aspect of the disclosure, the overall reflection surface of the micromirror array has a width $b_R$ and a height $h_R$, wherein the height $h_R$ corresponds to a predetermined multiple of the extent of the object field to be illuminated in the scanning direction. The height $h_R$ of the overall reflection surface corresponds, in particular, to an integer multiple of the extent of the object field in the scanning direction effectively employable for the illumination of the reticle multiplied by the inverse of the imaging scale of the illumination optical unit. In this case, the extent of the object field effectively employable for the illumination of the reticle should, in turn, be understood to mean the extent of the illumination field in the scanning direction minus the edge-side tolerance ranges. The effectively employable extent of the object field in the scanning direction lies in particular in the range from 1 mm to 10 cm, in particular in the range from 3 mm to 3 cm, in particular in the range from 6 mm to 1 cm.

In accordance with a further aspect of the disclosure, the micromirror arrays are arranged in lines, wherein the micromirror arrays of at least two adjacent lines have different shear angles. In particular, the micromirror arrays of adjacent lines can be sheared in opposite directions, parallel or antiparallel to the direction of the lines. In particular, the lines can be formed alternately of micromirror arrays with two different shears. Here, the micromirror arrays of adjacent lines can in each case have the same shear angle in terms of absolute value.

The properties of the illumination of the object field can be improved by arranging the micromirror arrays in lines with different, in particular with alternate, shearing.

A further object of the disclosure consists of improving an illumination system for a projection exposure apparatus. This object is achieved via an illumination system with an illumination optical unit according to the description above and a radiation source for generating illumination radiation.

In particular, the radiation source can be an EUV radiation source. Therefore, the radiation source can generate, in particular, illumination radiation in the EUV range, in particular in the wavelength range from 5 nm to 30 nm. Other radiation sources, in particular DUV or VUV radiation sources or radiation sources for generating illumination radiation in the visible range, in particular lasers, are likewise possible.

In accordance with one aspect of the disclosure, the illumination system is embodied in such a way that the object field is illuminated with a uniformity of better than 1%, in particular better than 0.5%, in particular better than 0.3%, in particular better than 0.2%, in particular better than 0.1%. The specified values in each case denote an upper limit for maximum uniformity variation, i.e. the maximum uniformity error. It transpired that this is possible with the aid of the assembly according to the disclosure, in particular with the aid of the micromirror array. By way of the embodiment of the micromirror array according to the disclosure, the contribution thereof to uniformity variations could be reduced.

With the aid of the micromirror array, it is possible, in particular, to improve the uniformity, i.e. the homogeneity, of the scanning energy (SE) over the field height x, i.e. the energy or radiation intensity which a field point, which is scanned over the object field, sees integrated over all directions.

Generally, $SE(x) = \int E(x,y) dy$ applies, where $E(x, y)$, the intensity distribution in the xy field plane, is dependent on x and y.

The variation of the scanning energy over the field height counts as a measure for the uniformity of the scanning energy in the field plane. Therefore, the uniformity is described by the following relationship for the uniformity error in percent:

$$\Delta SE = \frac{SE_{max} - SE_{min}}{SE_{max} + SE_{min}} \times 100 \, [\%]$$

Here:
$\Delta SE$: is the uniformity error or the variation of the scanning energy in %,
$SE_{Max}$: is the maximum value of the scanning energy, and
$SE_{Min}$: is the minimum value of the scanning energy.

The disclosure also seeks to provide an improved projection exposure apparatus for microlithography. This projection exposure apparatus includes an illumination optical unit according to the description above and a projection optical unit. The advantages are evident from those described above.

The disclosure also seeks to provide an improved method for producing a microstructured or nanostructured component. This method uses a provision of a projection exposure apparatus according to the disclosure. The advantages are evident from those described above.

BRIEF DESCRIPTION OF THE DRAWINGS

Further details, features and advantages of the disclosure will become apparent from the description of an exemplary embodiment with reference to the drawings. In detail.

DETAILED DESCRIPTION

Figure 1:
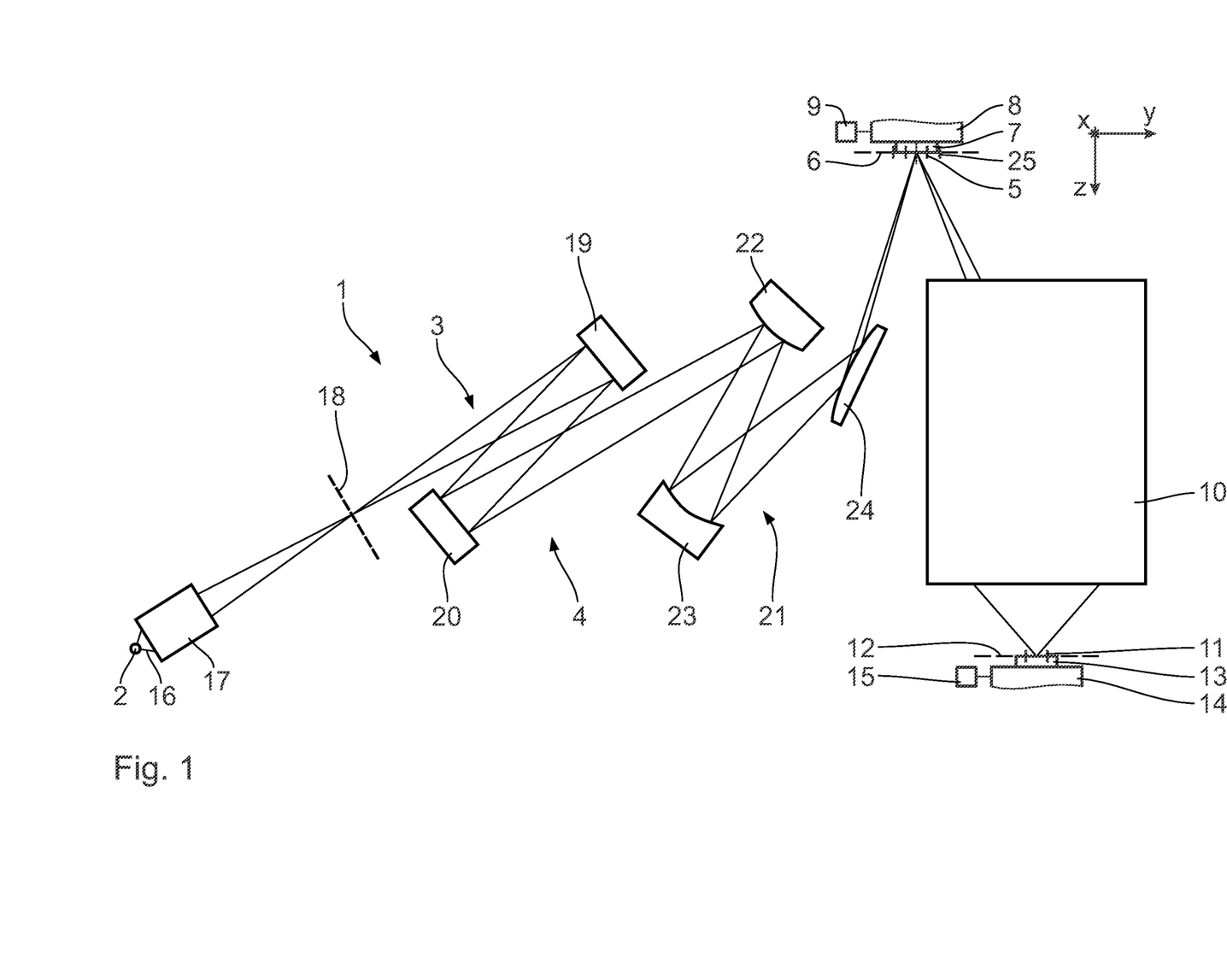
FIG. 1 schematically shows a meridional section through a projection exposure apparatus for EUV projection lithography, FIG. 2 schematically shows a plan view of the micromirror array.

FIG. 1 schematically shows a projection exposure apparatus 1 for microlithography in a meridional section. The projection exposure apparatus 1 includes a light or radiation source 2. An illumination system 3 of the projection exposure apparatus 1 has an illumination optical unit 4 for the exposure of an object field 5 of an object plane 6. In particular, the illumination system 3 leads to an illumination of an illumination field 25 in the object plane 6. The illumination field 25 preferably has the same size as the object field 5 to be illuminated. Where possible, the illumination field 25 has the same size in the scanning direction as the object field 5 to be illuminated, but it is not larger. In the direction perpendicular to the scanning direction, the illumination field 25 is preferably at least as large as the object field 5, but not smaller. In particular, the illumination field 25 is smaller than the object field 5 in the scanning direction by edge-side tolerance ranges 40. Overexposure in the scanning direction is reliably avoided hereby. Here, an object in the form of a reticle 7 arranged in the object field 5, which is held by an object or reticle holder 8, is exposed. The reticle 7 is also referred to as lithography mask. The object holder 8 is displaceable along a displacement direction by way of an object displacement drive 9. The displacement direction is also referred to as scanning direction. A projection optical unit 10 serves for imaging the object field 5 into an image field 11 in an image plane 12. A structure on the reticle 7 is imaged on a light-sensitive layer of a wafer 13 arranged in the region of the image field 11 in the image plane 12. The wafer 13 is held by a wafer holder 14. By way of a wafer displacement drive 15, the wafer holder 14 is likewise displaceable along the displacement direction in a manner synchronized with the object holder 8.

The radiation source 2 is an EUV radiation source having an emitted used radiation in the range of between 5 nm and 30 nm. This can be a plasma source, for example a GDPP (gas discharge-produced plasma) source or an LPP (laser-produced plasma) source. A radiation source based on a synchrotron or a free electron laser (FEL) is also employable as the radiation source 2. A person skilled in the art finds information about such a radiation source in, for example, U.S. Pat. No. 6,859,515 B2. EUV radiation 16 which emanates from the radiation source 2 is focused by a collector 17. A corresponding collector is known from EP 1 225 481 A. Downstream of the collector 17, the EUV radiation 16 propagates through an intermediate focal plane 18 before being incident on a field facet mirror 19. The field facet mirror 19 is a first facet mirror of the illumination optical unit 4. The field facet mirror 19 has a multiplicity of individual mirrors which are not depicted in FIG. 1. The field facet mirror 19 is arranged in a plane of the illumination optical unit 4 that is optically conjugate to the object plane 6.

The EUV radiation 16 is also referred to hereinafter as illumination light or as imaging light.

It is also possible to use a radiation source 2 which generates illumination light in a different wavelength range. In particular, the radiation source 2 can also be a DUV or VUV radiation source. This can also be a radiation source for generating illumination radiation in the visible wavelength range.

Figure 7:
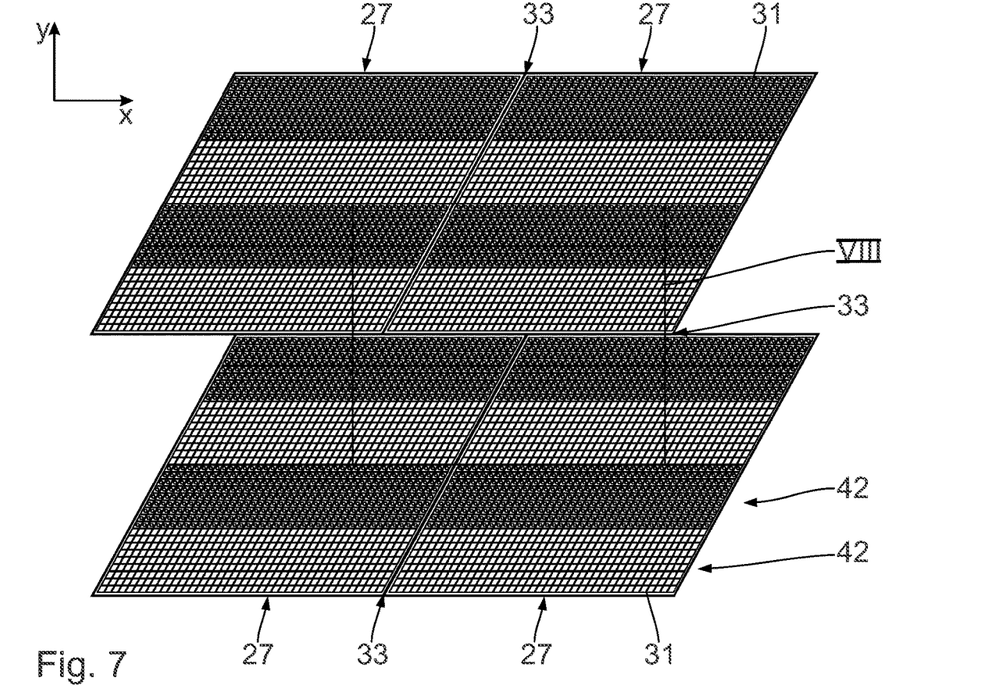
FIG. 7 shows a sectional magnification of the region VII from FIG. 4.
Figure 8:
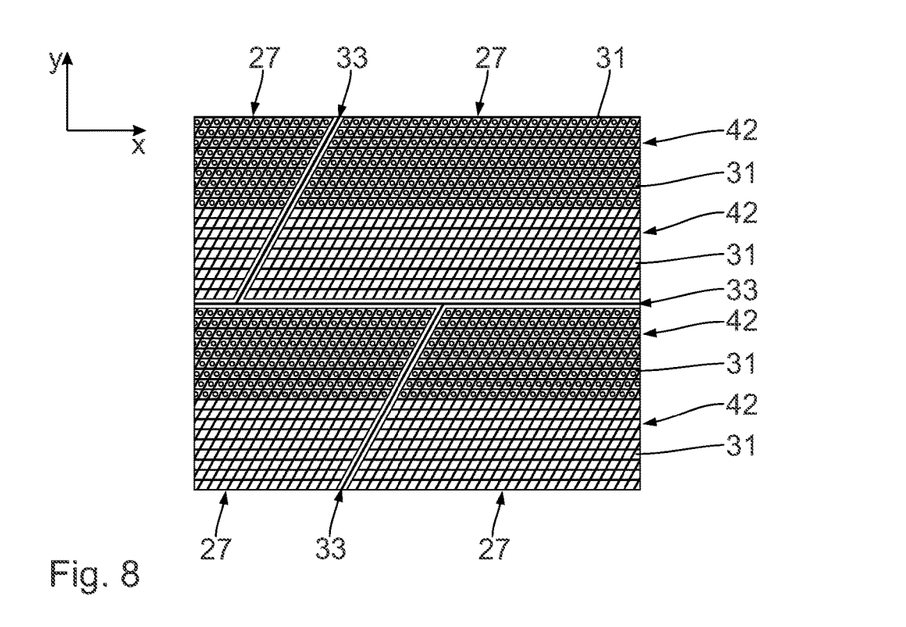
FIG. 8 shows a sectional magnification of the region VIII from FIG. 7.

Downstream of the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4, which pupil plane is optically conjugate to the intermediate focal plane 18 and to a pupil plane of the projection optical unit 10, or which coincides with this pupil plane. The pupil facet mirror 20 has a plurality of pupil facets which are not depicted in FIG. 1. Individual mirror groups 25 (cf. FIG. 7), which will still be explained in more detail below, of the field facet mirror 19 are imaged into the object field 5 with the aid of the pupil facets of the pupil facet mirror 20 and an imaging optical assembly, downstream thereof, in the form of a transfer optical unit 21 with mirrors denoted by 22, 23 and 24 in the order of the beam path. The last mirror 24 of the transfer optical unit 21 is a grazing incidence mirror.

In order to simplify the description of positional relationships, FIG. 1 plots a Cartesian xyz-coordinate system as a global coordinate system for the description of the positional relationships of components of the projection exposure apparatus 1 between the object plane 6 and the image plane 12. The x-axis extends perpendicular to the plane of the drawing in FIG. 1 and into the latter. In FIG. 1, the y-axis extends to the right and parallel to the displacement direction of the object holder 9 and of the wafer holder 14. In FIG. 1, the z-axis extends downward, i.e. perpendicular to the object plane 6 and to the image plane 12.

The x-dimension over the object field 5 or the image field 11 is also referred to as field height.

Figure 2:
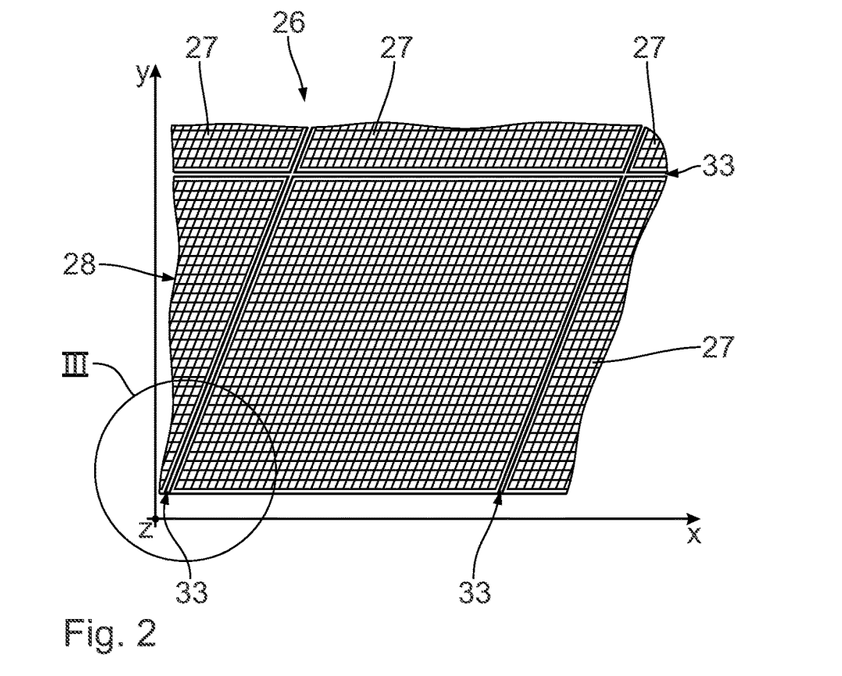
Figure 3:
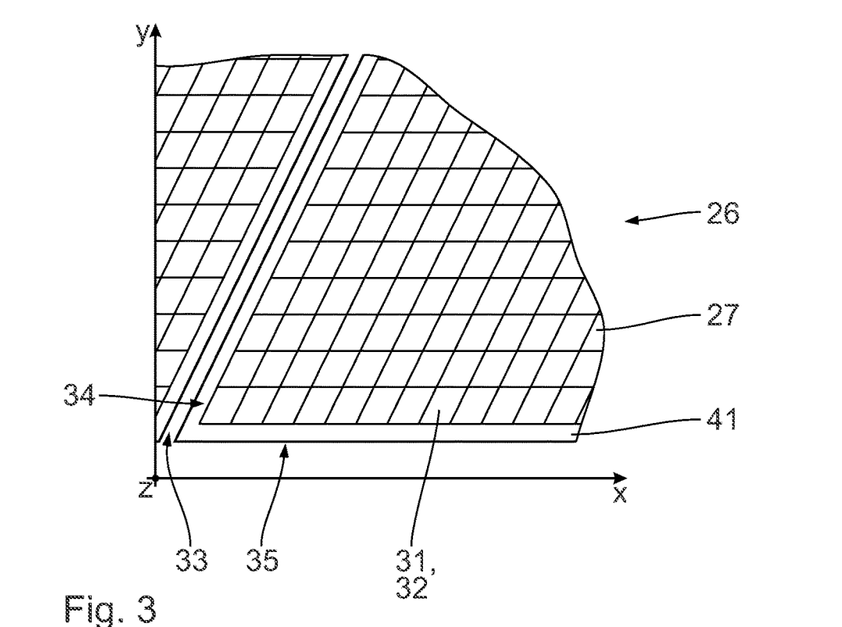
FIG. 3 shows a sectional magnification of the region III of the micromirror array in accordance with FIG. 2, FIG. 4 schematically shows a two-dimensional projection of a three-dimensional arrangement of micromirror arrays of a facet mirror, FIG. 5 schematically shows an illustration for elucidating the illumination of an object field, wherein the portions of individual micromirrors of one of the micromirror arrays in accordance with one of FIGS. 2 to 4 are depicted in an exemplary manner and wherein edge-side tolerance ranges in the scanning direction are elucidated in an exemplary manner.

FIGS. 2 and 3 show sections of an optical assembly 26 with a plurality of multi-mirror arrays 27 (MMAs).

With respect to further details about the general set-up of the projection exposure apparatus 1 and the functionality thereof, reference is made to DE 10 2012 207 866.5, which herewith, overall, is intended to be a component of the present application.

In particular, the optical assembly 26 can be a constituent of the field facet mirror 19. It can also be a constituent of the pupil facet mirror 20 or another element of the illumination optical unit 4.

In order to simplify the description of positional relationships, FIGS. 2 to 9 plot a Cartesian xyz-coordinate system as a local coordinate system of the optical assembly 26. The y-direction of the global coordinate system according to FIG. 1, i.e. the displacement direction for the reticle 7 and the wafer 13, and the y-direction of the local coordinate system in FIGS. 2 to 9 correspond to one another in this case. This should be understood to mean that the optical components of the illumination optical unit 4 are imaged in such a way that the y-direction of the local coordinate system extends at least approximately parallel to the y-direction of the global coordinate system, in particular parallel to the scanning direction.

The optical assembly 26 includes a multiplicity of MMAs 27. The MMAs 27 are arranged in lines 28. Here, the lines 28 are aligned parallel to the x-direction in each case. Therefore, the lines 28 are perpendicular to the y-direction, which is parallel to the scanning direction.

In particular, the MMAs 27 are arranged in a manner corresponding to the circles of latitude of one or more spheres. Here, the lines of latitude in each case extend perpendicular to the effective scanning direction on the field facet mirror 19. In particular, the positioning of the MMAs 27 along the line of latitude can be selected in such a way that there is an ideal coverage of the field facet mirror. In particular, this is understood to mean that the number of MMAs 27 to cover the field facet mirror 19 is minimized. Preferably, the MMAs 27 are arranged in such a way that the tilt angles for illuminating the pupil facets are as small as possible and/or the imaging scales vary as little as possible between the individual illumination channels and/or the far field of the radiation source 2 is covered with as few components as possible and with gaps that are as small as possible. The MMAs 27 in each case have a planar embodiment. However, they can be arranged on a curved surface, in particular on an ellipsoidal surface or on a surface of a sphere. With respect to details about the three-dimensional arrangement of the MMAs 27, reference is made to DE 10 2012 207 866.5.

The MMAs 27 in each case have a parallelogram-shaped embodiment. They are embodied in particular in a non-rectangular fashion. In particular, they have an internal angle that is greater than 100°.

The MMAs 27 each include a multiplicity of individual mirrors 31 which, on account of the dimensioning thereof, are also referred to as micromirrors 31. In particular, the individual mirrors 31 can each have side lengths in the range from 10 µm to 10 mm, in particular in the range from 100 µm to 1 mm, in particular in the range from 300 µm to 800 µm.

The individual mirrors 31 each have individual reflection surfaces 32. The individual reflection surfaces 32 have a parallelogram-shaped embodiment. In particular, in terms of geometry, they are similar to the overall reflection surface of the MMA 27.

In particular, the individual mirrors 31 are arranged in the style of a tessellation. In other words, apart from the gaps between the individual reflection surfaces 32 due to the construction, the MMA 27 is tessellated without gaps. The distances between the individual mirrors 31 of an MMA 27 are in particular less than 100 µm, in particular less than 30 µm, in particular less than 10 µm. In particular, the MMA 27 is free from interstices. On the other hand, an interstice 33 can be present between two adjacent MMAs 27. The interstice 33 is as narrow as possible. It can have an interstice width of less than 1 mm, in particular of less than 300 µm, in particular less than 100 µm. Since the MMAs 27 moreover have a circumferential edge 41, the overall reflection surfaces of two adjacent MMAs 27 are spaced apart by these two edges 41 and the interstice 33. The distance between the overall reflection surfaces of two adjacent MMAs 27 is preferably less than 1 mm. Preferably, it is smaller than the side length of one of the individual mirrors 31 in the corresponding direction.

The individual mirrors 31 are displaceable for the individual deflection of the illumination radiation 16. To this end, they are each connected to an actuator, which is not depicted in the figures. With respect to the displaceability of the individual mirrors 31 and the actuators provided herefor, reference is made, for example, to DE 10 2012 207 866.5.

The individual mirrors 31 are likewise arranged in lines 34 and columns 35. In particular, the lines 34 extend parallel to the lines 28. In particular, they are aligned parallel to the x-direction.

In particular, the columns 35 are arranged at an angle to the y-direction. They include an angle of at least 10° with the y-direction.

The individual mirrors 31 each have a parallelogram-shaped individual reflection surface 32. In particular, the edges of the individual reflection surfaces 32 are parallel in each case to those of the overall reflection surface of the associated MMA 27. In accordance with the embodiment depicted in FIGS. 2 and 3, the individual mirrors 31 are, in particular, arranged in such a way that the boundary of two adjacent individual reflection surfaces 32 in each case forms a flush line. This leads to the illumination of the object field 5 depicted in FIG. 5.

Figure 6:
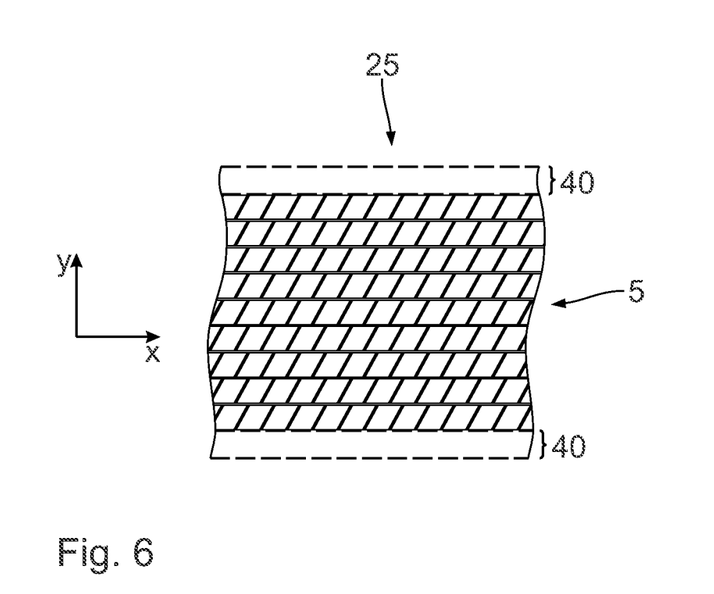
FIG. 6 shows an illustration corresponding to FIG. 5 with an alternative arrangement of the micromirrors within a micromirror array.

As an alternative hereto, it is also possible to arrange the individual mirrors 31 in adjacent lines with such an offset in relation to one another that the boundaries extending at an angle to the x-direction of two adjacent individual reflection surfaces 32 are not flush with one another in each case.

In particular, the individual reflection surface 32 of the individual mirrors 31 has the form of a sheared rectangle. In particular, individual mirrors 31 adjacent to one another in the scanning direction are offset perpendicular to the scanning direction in such a way as predetermined by the shear. As a result of such an arrangement, a very efficient suppression of the intensity variations is achieved in the object plane 6, in particular in the object field 5.

In particular, provision is made for all individual mirrors 31 of the MMA 27 to have, in terms of the geometry thereof, a similar, in particular identical, embodiment with respect to one another.

In the scanning direction, the MMAs 27 have an extent that corresponds to a multiple of the extent of a virtual facet 42 in the scanning direction. In the embodiment depicted in an exemplary manner in FIG. 7, four virtual facets 42, for example, fit on one MMA 27 in the y-direction. In the x-direction, the virtual facets 42 can extend over one or more MMAs 27. In particular, they can extend over two, three, four or more MMAs 27. In this example, the virtual facets 42 have a parallelogram-shaped embodiment. They have a height in the y-direction, i.e. an extent in the direction corresponding to the scanning direction, which corresponds to the height of nine individual mirrors 31 in this direction. In the x-direction, i.e. in the direction perpendicular to the scanning direction, they have an extent which corresponds to the extent of 72, 108 or 144 individual mirrors 31. However, alternative embodiments of the virtual facets 42 are likewise possible.

What can be achieved by arranging an integer multiple of virtual facets 42 on the MMAs 27 in the scanning direction is that the edges of the MMAs 27 extending perpendicular to the scanning direction are not imaged into the used region, i.e. not into the object field 5.

As a result of this, it is possible to reduce the number of gaps in the phase space. In particular, it is possible to reduce the number of gaps by 50%.

In particular, the virtual facets 42 are embodied in such a way in each case that they lead to a complete illumination of the object field 5 in the scanning direction in each case. In particular, they each lead to an illumination field 25 which, in the scanning direction, is smaller than the object field 5 to be illuminated by no more than the tolerance ranges 40.

Using the MMAs 27 according to the disclosure, it is possible to obtain a lower degree of filling of the pupil. As a result of the smaller number of gaps, intensity variations in the object field 5 can be reduced.

By arranging the MMAs 27 and, in particular, the individual mirrors 31 in lines 28 and 34, respectively, parallel to the x-direction, i.e. perpendicular to the scanning direction, it is possible to improve the fill of the object field 5, in particular in the case of a rectangular object field 5. This also allows a smaller degree of filling of the pupil and therefore a better resolution.

A further arrangement of the MMAs 27 is described below with reference to FIG. 9. While all MMAs 27 are embodied as sheared in the same direction in the embodiment in accordance with FIG. 4 such that any two MMAs 27 in the two-dimensional projection depicted in FIG. 4 appear displaced parallel to one another in each case, the MMAs 27 of adjacent lines 28 are in each case sheared in opposite directions in accordance with the embodiment depicted in FIG. 9. Therefore, the boundaries of the MMAs 27 of adjacent lines 28 extending at an angle to the lines are not parallel to one another. This leads to breaking the symmetry, in particular in the pupil, which leads to an improvement of the properties of the illumination of the object field 5.

In general, the MMAs 27 of adjacent lines 28 have different shear angles. This should also be understood to mean that the shear angles, as depicted in FIG. 9 in an exemplary manner, are the same in terms of absolute value but have alternating signs.

Figure 4:
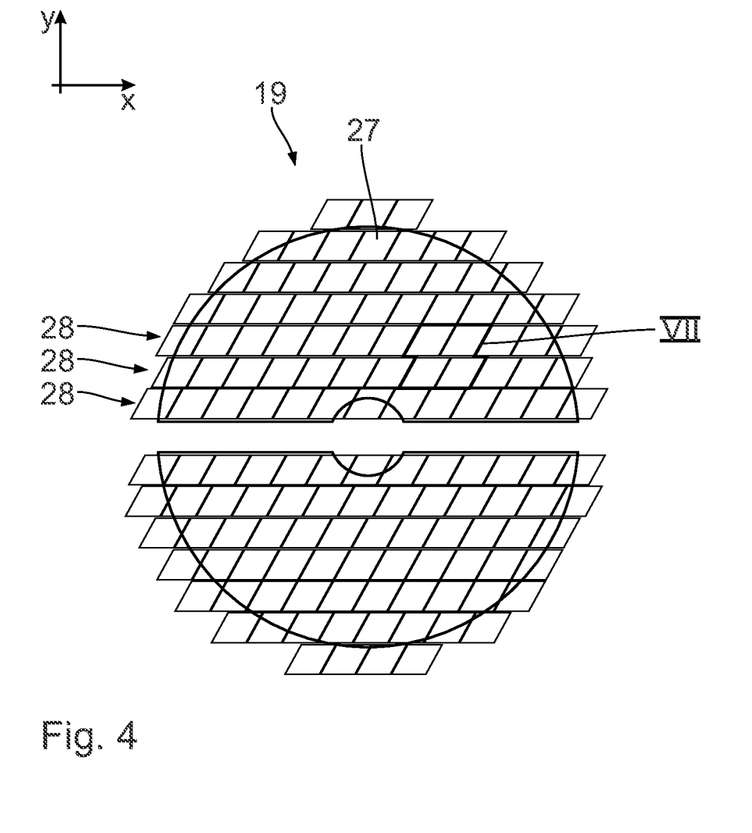
Figure 5:
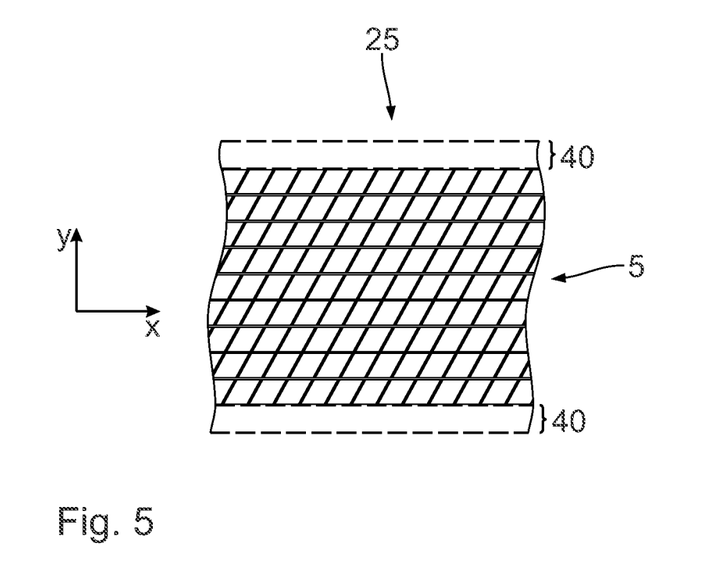
Figure 9:
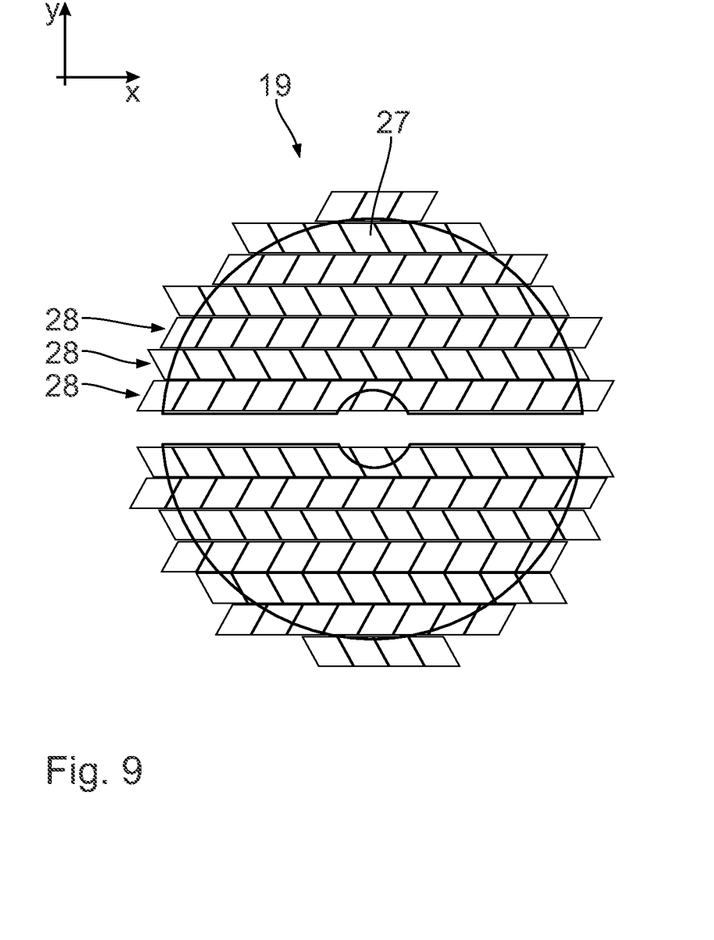
FIG. 9 shows an illustration corresponding to FIG. 4 with an alternative arrangement of the micromirror arrays.

For completeness' sake, it is noted that the MMAs 27 are depicted in a magnified manner in FIGS. 4 and 9 for the sake of clarity. The actual number of MMAs 27 of the facet mirror 19 can be substantially larger than what is depicted in these figures. During the projection exposure, at least one part of the reticle 7 in the object field 5 is imaged, with the aid of the projection exposure apparatus 1, onto a region of the light-sensitive layer on the wafer 13 in the image field 11 for the lithographic production of a microstructured or nanostructured component, in particular of a semiconductor component, for example of a microchip. Here, the reticle 7 and the wafer 13 can be displaced in a manner synchronized in time in the scanning direction.

The invention claimed is:
1. A micromirror array, comprising:
   a multiplicity of micromirrors comprising individual reflection surfaces,
   wherein:
      for each of the multiplicity of micromirrors, the reflection surface has a non-rectangular form;
      the micromirror array has an overall reflection surface having a non-rectangular parallelogram shape;
      all of the multiplicity of micromirrors have a geometrically similar form relative to the other another;
      the overall reflection surface has a smooth edge;
      the micromirror array is tessellated without gaps; and
      the individual mirrors are displaceable.
2. The micromirror array of claim 1, wherein the non-rectangular parallelogram shape of the overall reflection surface has an internal angle that is greater than 100°.
3. The micromirror array of claim 1, wherein the form of the individual reflection surfaces is geometrically similar to the non-rectangular parallelogram shape of the overall reflection surface.

4. The micromirror array of claim 1, wherein the individual reflection surfaces are reflective for radiation in the EUV range.

5. An optical assembly, comprising:
a micromirror array according to claim 1,
wherein the optical assembly is a microlithography optical assembly.

6. An illumination optical unit configured to transmit illumination radiation from a radiation source into an object field of an object plane, the illumination optical unit comprising:
an optical assembly comprising a micromirror array according to claim 1,
wherein the optical assembly is a microlithography optical assembly.

7. The illumination optical unit of claim 6, wherein:
the micromirror array is configured so that, when impinged with the illumination radiation during use of the illumination optical unit, the micromirror array leads to an illumination field in the object plane; and
the illumination field has a boundary which corresponds to a boundary of the object field in a scanning direction.

8. The illumination optical unit of claim 6, wherein the micromirror array has a boundary edge aligned perpendicular to the scanning direction.

9. The illumination optical unit of claim 6, wherein the micromirror array has an extent in a first direction which is an integer multiple of a height of a virtual facet.

10. The illumination optical unit of claim 6, comprising a multiplicity of micromirror arrays arranged in lines, wherein the micromirror arrays of at least two adjacent lines have a different shear angle.

11. The illumination optical unit of claim 6, comprising a multiplicity of micromirrors arranged in lines and columns, wherein the columns are arranged at an angle to a scanning direction.

12. The illumination optical unit of claim 11, wherein the micromirror array has a boundary edge aligned perpendicular to the scanning direction.

13. An illumination system, comprising:
an illumination optical unit configured to transmit illumination radiation from a radiation source into an object field of an object plane, the illumination optical unit comprising an optical assembly comprising a micromirror array according to claim 1; and
a radiation source configured to generate the illumination radiation,
wherein the illumination system is a microlithography illumination system.

14. The illumination system of claim 13, wherein the illumination system has a uniformity of the illumination of the object field with a uniformity error of less than 1%.

15. An apparatus, comprising:
an illumination optical unit configured to transmit illumination radiation from a radiation source into an object field of an object plane, the illumination optical unit comprising an optical assembly comprising a micromirror array according to claim 1; and
a projection optical unit,
wherein the apparatus is a projection exposure apparatus.

16. A method of using a projection exposure apparatus comprising an illumination optical unit and a projection optical unit, the method comprising:
using the illumination optical unit to illuminate reticle comprising structures; and
using the projection optical unit to project illuminated structures of the reticle onto a light-sensitive material,
wherein the illumination optical unit comprising an optical assembly comprising a micromirror array according to claim 1.

17. A micromirror array, comprising:
a multiplicity of micromirrors comprising individual reflection surfaces,
wherein:
for each of the multiplicity of micromirrors, the reflection surface has a non-rectangular parallelogram shape;
the micromirror array has an overall reflection surface having a non-rectangular parallelogram shape;
all of the multiplicity of micromirrors have a geometrically similar form relative to the other another;
the micromirror array is tessellated without gaps; and
the individual mirrors are displaceable.

18. The micromirror array of claim 17, wherein, for each of the multiplicity of micromirrors, the non-rectangular parallelogram shape of the reflective surface has an internal angle that is greater than 100°.

19. The micromirror array of claim 17, wherein the non-rectangular parallelogram shape of the overall reflection surface has an internal angle that is greater than 100°.

20. An optical assembly, comprising:
a micromirror array according to claim 17,
wherein the optical assembly is a microlithography optical assembly.

* * * * *